(12) United States Patent
Rangarajan et al.

(10) Patent No.: US 6,376,013 B1
(45) Date of Patent: Apr. 23, 2002

(54) MULTIPLE NOZZLES FOR DISPENSING RESIST

(75) Inventors: Bharath Rangarajan, Santa Clara; Bhanwar Singh, Morgan Hill; Sanjay K. Yedur, Santa Clara; Michael K. Templeton, Atherton, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/413,143

(22) Filed: Oct. 6, 1999

(51) Int. Cl.[7] .................. B05D 1/00; B05C 11/02; B05C 13/02
(52) U.S. Cl. .................. 427/240; 427/9; 118/52; 118/712; 118/612; 118/319
(58) Field of Search ................. 118/52, 53, 54, 118/712, 600, 612, 667, 107, 218, 232, 233, 319; 427/240, 8, 9

(56) References Cited

U.S. PATENT DOCUMENTS

| | | | |
|---|---|---|---|
| 5,089,305 A | | 2/1992 | Ushijima et al. ............ 427/422 |
| 5,127,362 A | * | 7/1992 | Iwatsu et al. ............... 118/667 |
| 5,366,757 A | | 11/1994 | Lin ................................ 427/9 |
| 5,393,624 A | * | 2/1995 | Ushijima ....................... 430/30 |
| 5,718,992 A | * | 2/1998 | Sato et al. ..................... 430/7 |
| 5,720,814 A | * | 2/1998 | Takagi et al. ................ 118/319 |
| 5,845,170 A | | 12/1998 | Ogata ........................... 396/604 |
| 5,968,268 A | * | 10/1999 | Kitano et al. .................. 118/52 |

* cited by examiner

Primary Examiner—Richard Crispino
Assistant Examiner—Yewebdar T Tadesse
(74) Attorney, Agent, or Firm—Amin & Turocy, LLP (57) ABSTRACT

A system and method is provided that facilitates the application of a uniform layer of photoresist material spincoated onto a semiconductor substrate (e.g. wafer). The present invention accomplishes this end by utilizing a measurement system that measures the thickness uniformity of the photoresist material applied on a test wafer by a nozzle, and then adjusting the viscosity of the photoresist material by varying the ratio in a solvent/resist mixture, and/or adjusting the temperature of the mixture. A system and method that employs a plurality of nozzles is also provided that disperses resist at different annular regions on a wafer to facilitate the application of a uniform layer of photoresist material spincoated onto the wafer. The system and method utilize a measurement system that measures the thickness and thickness uniformity of each layer of photoresist material applied at each annular region of the wafer. The measured thickness uniformity and overall thickness for each annular region is then used to adjust the volume and viscosity of a solvent/resist mixture applied through each nozzle.

30 Claims, 8 Drawing Sheets

I # MULTIPLE NOZZLES FOR DISPENSING RESIST

TECHNICAL FIELD

The present invention generally relates to semiconductor processing, and in particular to a system for uniformly distributing a photoresist material on a wafer.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as comers and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist material, thickness uniformity of the photoresist material is a significant factor in achieving desired critical dimensions. The photoresist material should be applied such that a uniform thickness is maintained in order to ensure uniformity and quality of the photoresist material layer. The photoresist material layer thickness typically is in the range of 0.1 to 3.0 microns. Good resist thickness control is highly desired, and typically variances in thickness should be less than ±10–20 Å across the wafer. Very slight variations in the photoresist material thickness may greatly affect the end result after the photoresist material is exposed by radiation and the exposed portions removed.

Application of the resist onto the wafer is typically accomplished by using a spin coater. The spin coater is essentially a vacuum chuck rotated by a motor. The wafer is vacuum held onto the spin chuck. Typically, a nozzle supplies a predetermined amount of resist to a center area of the wafer. The wafer is then accelerated to and rotated at a certain speed, and centrifugal forces exerted on the resist cause the resist to disperse over the whole surface of the wafer. The resist thickness obtained from a spin coating process is dependent on the viscosity of the resist material, spin speed, the temperature of the resist and temperature of the wafer. However, the resist is not always uniformly formed on the wafer because the resist may dry too early causing the resist to become more viscous and not easily flow as it disperses across the wafer. These effects become increasingly problematic for larger wafers, such as twelve inch wafers, because of the larger area the resist must cover. Larger wafers also have mechanical constraints with regards to rotation speed.

Figure 1A:
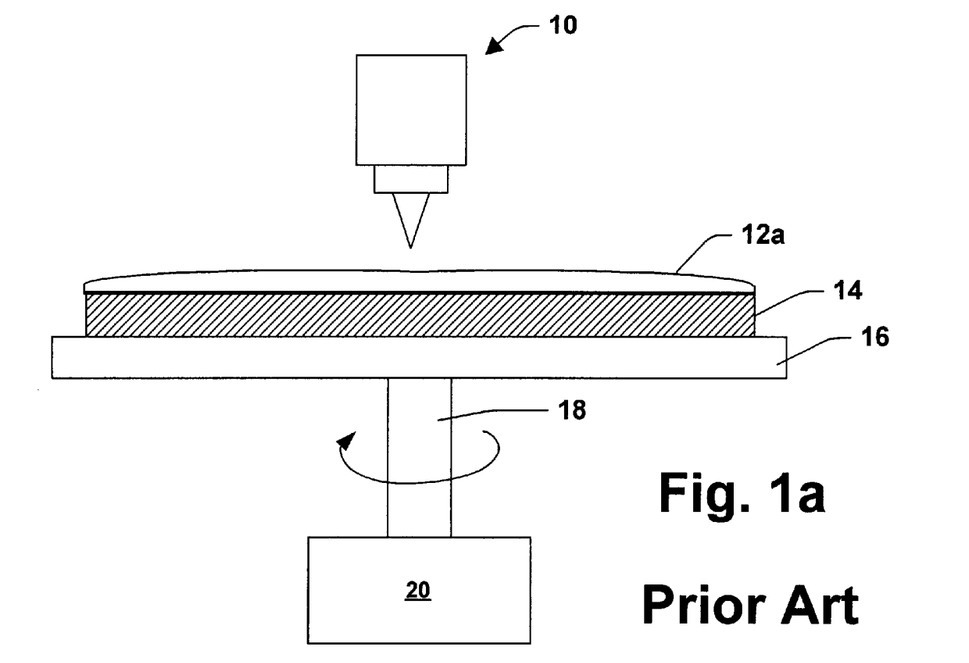
FIG. 1a is representative schematic block diagram of a photoresist material application system in accordance with one problem of the prior art.
Figure 1B:
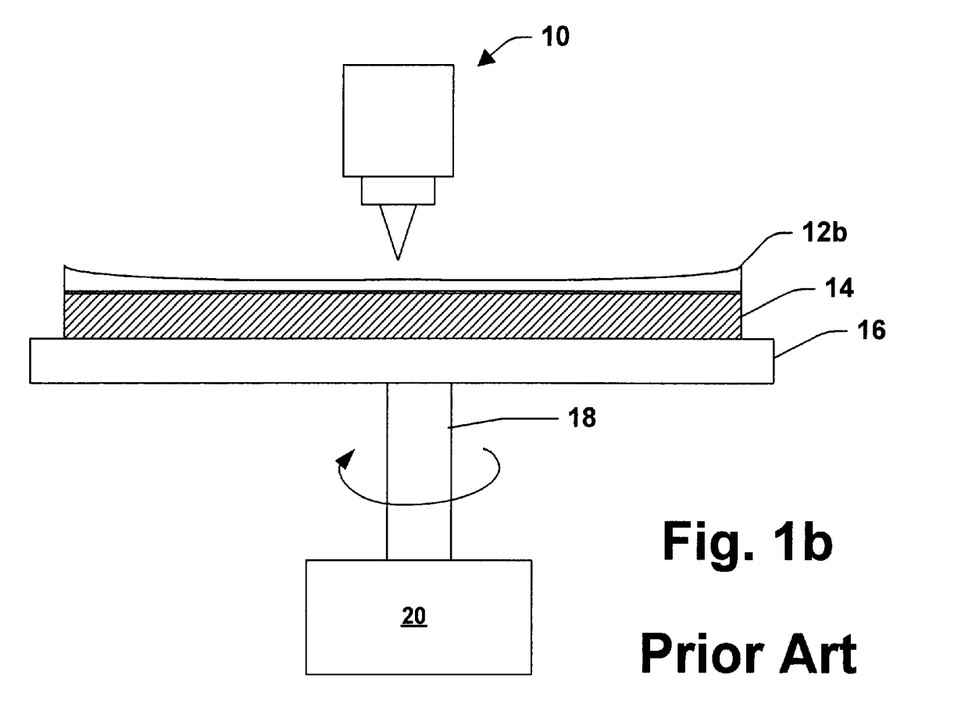
FIG. 1b is representative schematic block diagram of a photoresist material application system in accordance with another problem of the prior art.

FIGS. 1a and 1b illustrate typical problems that can occur in applying resist to a wafer at a given speed. A nozzle 10 applies a resist layer 12 on a central area of a wafer 14. The wafer 14 is vacuum held onto a rotating chuck 16 driven by a shaft 18 coupled to a motor 20. The wafer 14 is rotated at a constant speed and the resist flows covering the entire top surface of the wafer. FIG. 1a. illustrates an example where the resist employed had a viscosity that was too high at a given speed. The resulting resist layer 12a is concave in shape because the resist dried too quickly causing the flow of the resist to slow as it spread out over the top surface of the wafer 14. FIG. 1b illustrates an example where the resist had a viscosity that was too low at a given speed. The resulting resist layer 12b is convex in shape because the resist flowed too quickly from the center, and did not begin drying until much of the resist was near an outer circumference of the wafer 14.

The resulting concave and convex resist layers 12a and 12b do not have uniform thicknesses which may lead to impaired device performance. In view of the above, a system/method is needed, for forming a uniform layer of resist across a wafer.

SUMMARY OF THE INVENTION

The present invention provides for a system and method that facilitates the application of a uniform layer of photoresist material spincoated at a constant speed onto a semiconductor substrate (e.g wafer). The present invention accomplishes this end by utilizing a measurement system that measures the thickness uniformity of the photoresist material applied on a test wafer by a nozzle, and then adjusting the viscosity of the photoresist material by varying the ratio in a solvent/resist mixture and/or adjusting the temperature of the mixture. After the viscosity adjustment, a new test wafer is spincoated and measured and the adjustment is repeated until the layer of photoresist material meets predefined tolerances of uniformity. Once the predefined tolerances are met, the values are stored for use in a mass production run. The system can also vary the overall thickness of the resist layer by using the measured data in determining the overall thickness of the resist layer, and controlling the overall volume of the solvent/resist mixture.

The present invention also provides for a system and method that employs a plurality of nozzles that disperse resist at different annular regions on a wafer to facilitate the application of a uniform layer of photoresist material spincoated at a constant speed onto the wafer. The system and method utilize a measurement system that measures the thickness and thickness uniformity of each layer of photoresist material applied at each annular region of the wafer. The measured thickness and overall thickness uniformity for each annular region is then employed to adjust the volume and viscosity of a solvent/resist mixture applied through each nozzle. The viscosity of the solvent/resist mixture of each nozzle is adjusted by varying the ratio of the solvent/resist mixture, and by varying the temperature of the mixture. After the viscosity and volume adjustment, a new test wafer is spincoated and measured and the adjustment is repeated until the layer of photoresist material meets predefined tolerances of uniformity. Once the predefined tolerances are met, the values are stored for use in a mass production run. The overall thickness can be adjusted by increasing the volume of solvent/mixture in each nozzle.

One particular aspect of the invention relates to a system for spincoating a uniformly thick layer of photoresist material on a substrate where the layer of photoresist material is spincoated onto the substrate by a rotating chuck coupled to a motor. The system includes a nozzle adapted to apply a predetermined volume of photoresist material to the center of the substrate. The system also includes a measuring system adapted to measure the thickness of the layer of photoresist material at different points along the substrate after the photoresist material is spincoated onto the substrate. A processor is operatively coupled to the measuring system and a viscosity adjustment system. The processor receives thickness data from the measuring system and uses the data to provide adjustment information to the viscosity adjustment system for adjusting the viscosity of the photoresist material, so that a layer of photoresist material having a more uniform thickness can be spincoated onto a subsequent substrate.

Another aspect of the present invention relates to a system for spincoating a uniformly thick layer of photoresist material on a substrate where the layer of photoresist material is spincoated onto the substrate by a rotating chuck coupled to a motor. The system includes means for applying a layer of photoresist material on the substrate, measurement means for determining the thickness of the photoresist material layer at different regions on the substrate and producing data relating to the thickness of the photoresist material layer and means for evaluating the data and determining the thickness uniformity of the layer of photoresist material. The system also includes viscosity adjustment means for varying the viscosity of the photoresist material based on the thickness uniformity of the photoresist material layer.

Yet another aspect of the present invention relates to a method for spincoating a uniform layer of photoresist material on a substrate comprising the steps of: applying a predetermined volume of photoresist material to the center of a substrate; spin coating the substrate until the photoresist material forms a layer on the substrate; measuring the thickness of the layer at a variety of regions on the substrate and generating data based on the measurements; determining the thickness uniformity of the layer based on the data; and adjusting the viscosity of the photoresist material in accordance with the thickness uniformity of the layer.

Still yet another aspect of the present invention relates to a system for spincoating a uniformly thick layer of photoresist material on a substrate where the layer of photoresist material is spincoated onto the substrate by a rotating chuck coupled to a motor. The substrate is formed of a plurality of annular regions extending from the center of the substrate to the outer circumference of the substrate. The system includes a plurality of nozzles, each adapted to apply a predetermined volume of photoresist material at one of the plurality of annular regions, and a measuring system adapted to measure the thickness of the layer of photoresist material at different points along the substrate after the photoresist material is spincoated onto the substrate. A processor is operatively coupled to the measuring system and a viscosity adjustment system. The processor receives thickness data from the measuring system and uses the data to adjust the viscosity of the photoresist material for at least one of the plurality of nozzles, so that a layer of photoresist material having a more uniform thickness can be spincoated onto a subsequent substrate.

Still another aspect of the present invention relates to a method for spincoating a uniformly thick layer of photoresist material on a substrate where the substrate is formed of a plurality of annular regions extending from the center of the substrate to the outer circumference of the substrate. The method includes the steps of: providing a plurality of nozzles wherein each nozzle is adapted to apply a predetermined volume of photoresist material at one of the plurality of annular regions; applying a predetermined volume of photoresist material from each nozzle to each annular region; spin coating the substrate until the photoresist material forms a layer on the substrate; measuring the thickness of the layer at a variety of regions on the substrate and generating data based on the measurements; determining the thickness uniformity of the layer based on the data; and adjusting the viscosity of the photoresist material for at least one of the plurality of nozzles in accordance with the thickness uniformity of the layer.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention will be described with reference to a system for controlling the thickness uniformity and the overall thickness of a photoresist material layer applied onto a wafer. The following detailed description is of the best modes presently contemplated by the inventors for practicing the invention. It should be understood that the description of these preferred embodiments are merely illustrative and that they should not be taken in a limiting sense.

Figure 2:
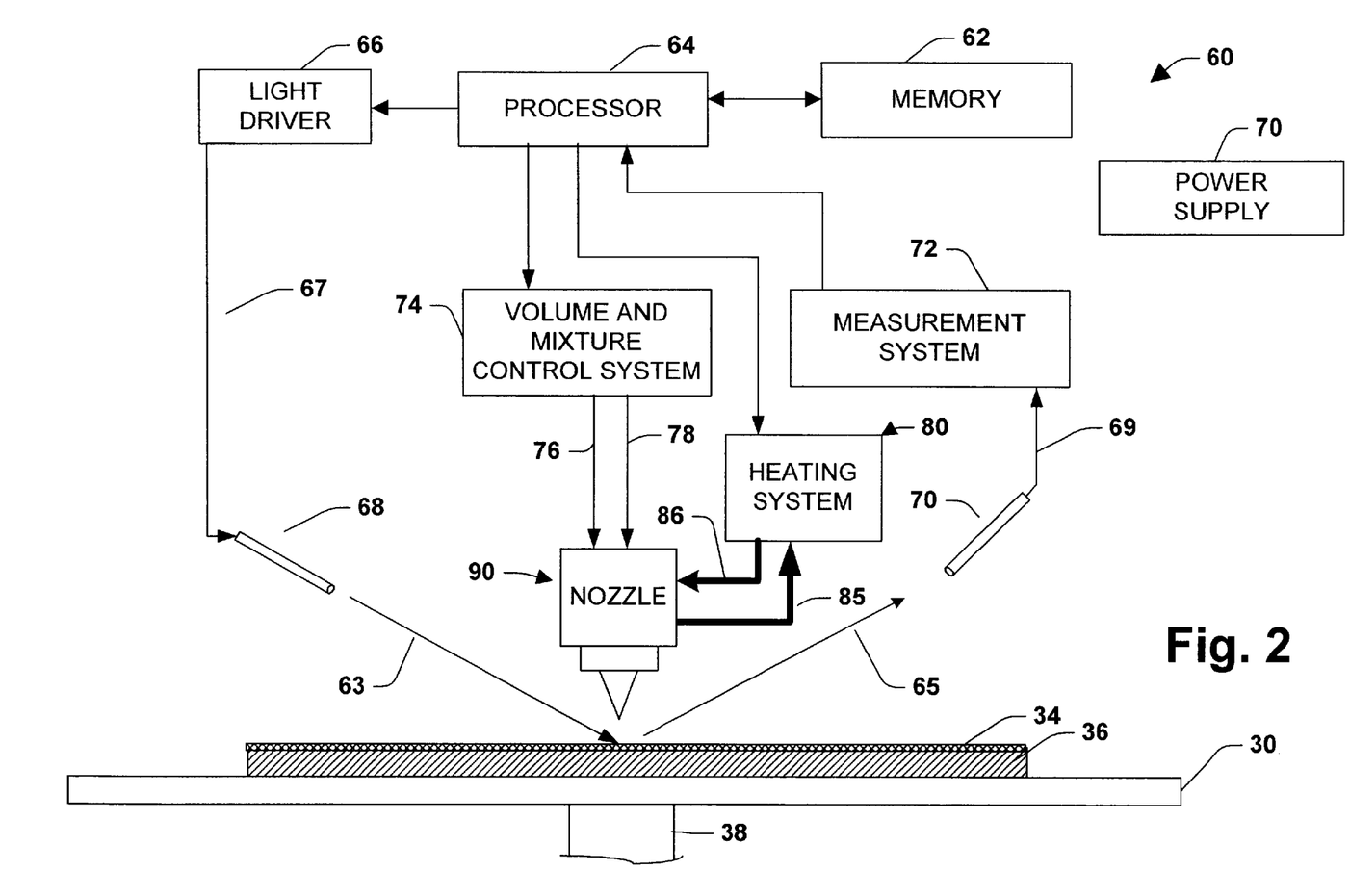
FIG. 2 is a schematic block diagram of a photoresist material application system in accordance with the present invention.

Referring initially to FIG. 2, a system 60 for applying uniformly a photoresist material layer 34 on a substrate 36 is shown. The substrate 36 is vacuum held onto a rotating chuck 30, which is spin rotated by a shaft 38 driven by a motor (not shown). It is to be appreciated that the present invention may be applied to pre-baking as well as post exposure baking of the photoresist material. Furthermore, although the present invention is primarily described within the context of uniformly applying a layer of photoresist material, it is to be understood that the present invention may be applied to applying uniform layers of top and bottom anti-reflective coatings, low K dielectric materials, spin-on-glass (SOG) and other spin-on materials. After the photoresist material 34 is dried, suitable photolithographic techniques may be performed to pattern the substrate 36 in a desired manner.

The system 60 further includes a thickness measurement system 72. A light source 68 is connected by a fiber optic line 67 to a light driver 66. The light driver 66 is turned on and off for thickness measurements of the resist layer 34 by a processor 64. The light source 68 sends a ray of light 63 at the resist layer 34, which is reflected as a ray of light 65 to a light receiver 70 which is coupled to the measurement system 72 for making resist thickness measurements. The light receiver 70 is connected to the measurement system 72 by a fiber optic line 69. It should be appreciated that light source 68 and light receiver 70 may be rotatable so that thickness measurements can be performed at various points along the resist layer 34. It should be further appreciated that light source 68 could comprise a plurality of fiber optic connections and light sources and light receiver 70 could include a plurality of fiber optic connections, and light receivers for detecting thickness along different points of the resist layer. It should be noted that the same system employed to make thickness measurements could also provide temperature information of the resist layer 34.

The measurement system 72 could be a polychromatic interferometer system or a monochromatic interferometer system to measure the resist thickness. It is to be appreciated that any suitable interferometry system and/or spectrometry system may be employed to carry out the present invention and such systems are intended to fall within the scope of the hereto appended claims. Interferometry systems and spectrometry systems are well known in the art, and therefore further discussion related thereto is omitted for sake of brevity.

The processor 64 receives the measured data from the measuring system 72 and determines the overall thickness and the thickness uniformity of the photoresist material layer 34 by classical signal analysis and estimation algorithms. The processor 64 is programmed to control and operate the various components within the photoresist material application system 60 in order to carry out the various functions described herein. The processor or CPU 64 may be any of a plurality of processors, such as the AMD K7 and other similar and compatible processors. The manner in which the processor 64 can be programmed to carry out the functions relating to the present invention will be readily apparent to those having ordinary skill in the art based on the description provided herein.

A memory 62 which is operatively coupled to the processor 64 is also included in the system 60 and serves to store program code executed by the processor 64 for carrying out operating functions of the system 60 as described herein. The memory 62 includes read only memory (ROM) and random access memory (RAM). The ROM contains among other code the Basic Input-Output System (BIOS) which controls the basic hardware operations of the system 60. The RAM is the main memory into which the operating system and application programs are loaded. The memory 62 also serves as a storage medium for temporarily storing information such as photoresist material volume settings, temperature settings, photoresist material coordinate tables, interferometry information, spectrometry information and other data which may be employed in carrying out the present invention. For mass data storage, the memory 62 may include a hard disk drive (e.g., 10 Gigabyte hard drive).

Power supply 70 provides operating power to the system 60. Any suitable power supply (e.g., battery, line power) may be employed to carry out the present invention.

The processor 64 is also coupled to a volume and mixture control system 74. The volume and mixture control system 74 is operatively coupled to a nozzle 90, which applies resist to the center of substrate 36. The photo resist material layer 34 is formed by a combination of photoresist and solvent added to the photoresist. The solvent could be a mixture of ethoxy ethyl acetate and butyrol acetone or the like, but any suitable solvent that allows control of the viscosity of the photoresist/solvent mixture could be used. The solvent combines with the photoresist to control the viscosity of the photoresist material, so that it does not dry too early or too late when spin coated onto the substrate 36. The total volume of the resist and solvent mixture and the ratio of the resist to solvent in the mixture is maintained by electronically controlled valves controlled by control line 76 and 78 of the volume and mixture control system 74.

The processor 64 is also electronically coupled to a heating system 80 that provides temperature control of the resist and solvent mixture. The temperature of the mixture also plays an important role in the viscosity of the resist. Therefore, the resist viscosity can be controlled by varying the resist and solvent ratio in the resist and solvent mixture and/or varying the temperature of the resist and solvent mixture. The heating system 80 includes an inlet water supply line 86 and an outlet water supply line 85 for providing heated water to the nozzle 90, such that the temperature of the resist and solvent mixture can be controlled by the temperature of the water.

Figure 3:
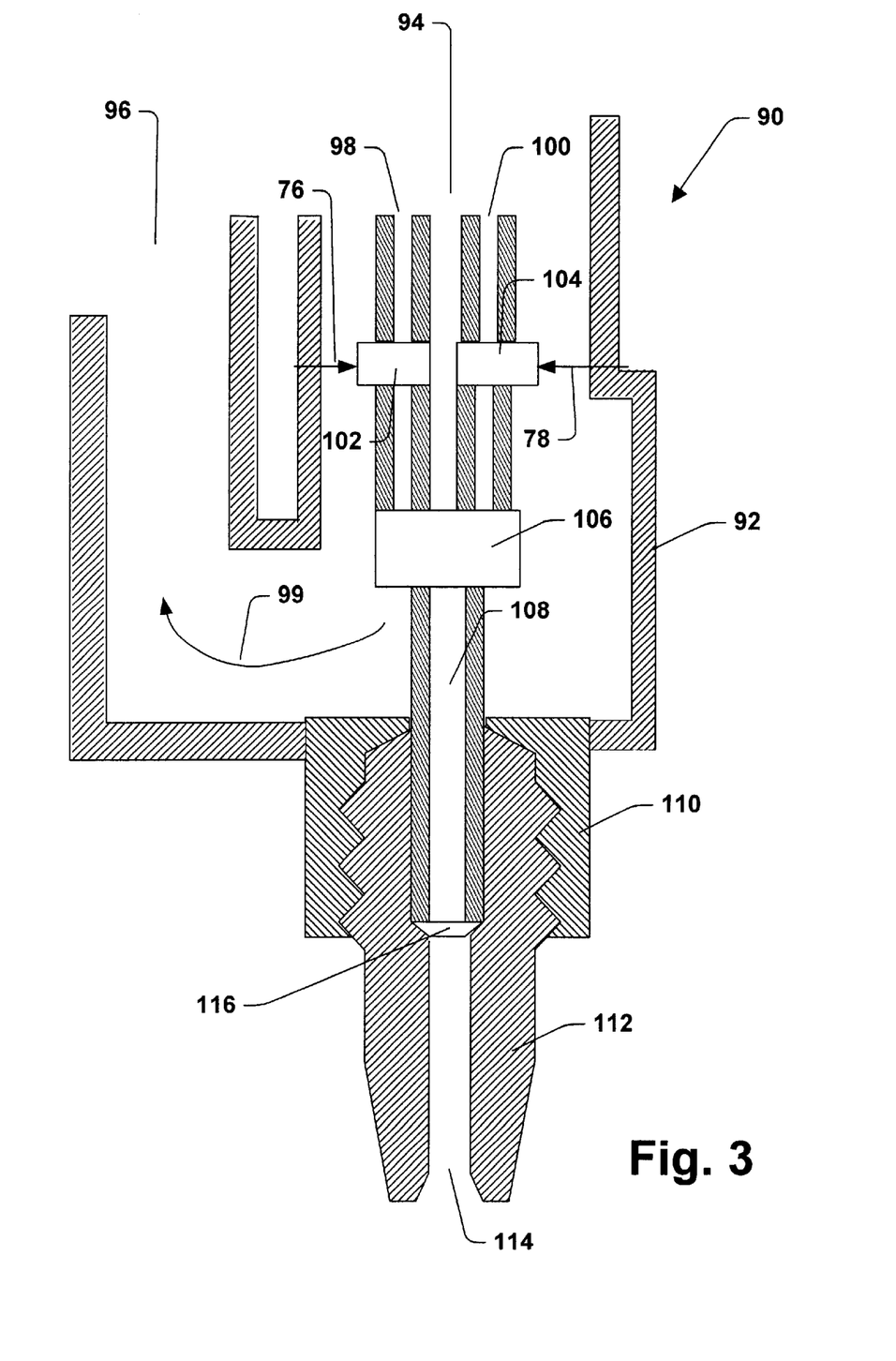
FIG. 3 is a cross-sectional view of a nozzle used in accordance with the present invention.

Referring now to FIG. 3, the nozzle 90 includes a holder 92 having a water inlet port 94 and a water outlet port 96 that are adapted to be coupled to the inlet water supply line 86 and the outlet water supply line 85, respectively, of the heating system 80. The water flows from the inlet port 94 through the outlet port 96 in the direction of arrow 99. A resist supply tube 98 has one end disposed within the holder 92 and its other end connected to a supply of photoresist (not shown). A solvent supply tube 100 has one end disposed within the holder 92, and its other end connected to a supply of solvent material (not shown). A resist adjustment valve 102 and a solvent adjustment valve 104 determine the amount of resist and solvent that is received into a mixing chamber 106. It is to be appreciated that a static mixer may be employed to facilitate mixing. Both valves are electronically controlled by control lines 76 and 78, respectively, coupled to the volume and mixture control system 74. The valves can determine the amount of resist and solvent that will be applied to the substrate 34, and also the ratio of the resist and solvent in the resist and solvent mixture. The mixing of the resist and solvent is provided in the mixing chamber 106 simply by simultaneously supplying resist and solvent in the chamber. It should be apparent that other mixing techniques could be employed to provide mixing of the resist and solvent (e.g. vibration, rotation, churning etc.). A collar 110 is connected to the bottom of the holder 92 and includes a central aperture for allowing a resist and solvent mixture supply barrel 108 to pass therethrough. The collar 110 threadingly engages a nozzle tip 112. Supply barrel 108 is connected to the mixing chamber 106 on one end and passes through the center of nozzle tip 112. The supply barrel 108 includes a liquid discharge opening 116 that discharges the resin and solvent mixture through a liquid discharge channel 114 of the nozzle tip 112 to the center of substrate 34.

Figure 4A:
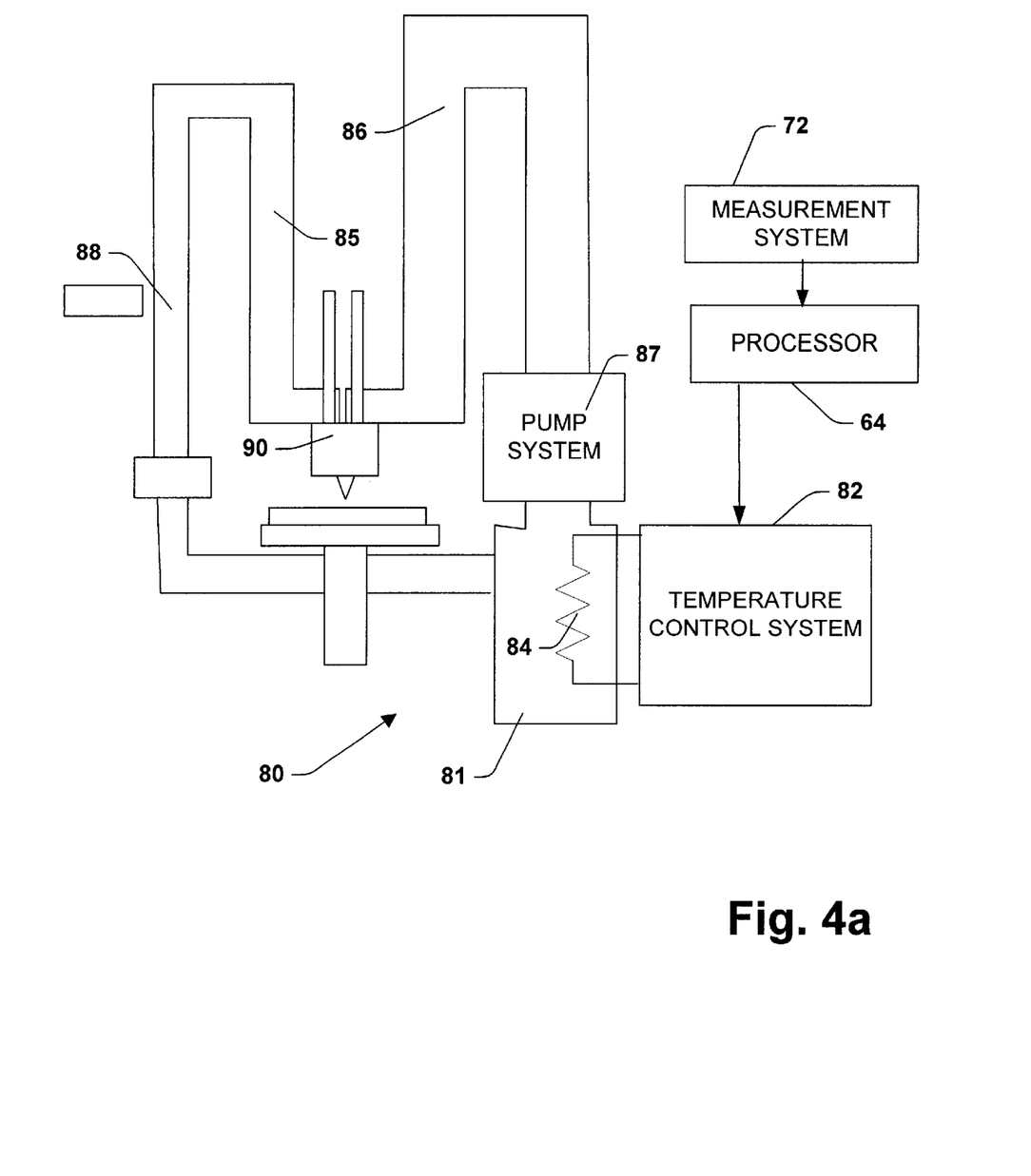
FIG. 4a is a partial schematic block diagram illustrating a heating system in accordance with the present invention.

FIG. 4a illustrates the heating system 80 used to control the temperature of the resin and solvent mixture. The heating system 80 includes a heat regulator 81, a heat exchanger 84, a temperature control system 82, a pump system 87, the inlet line 86, the outlet line 85 and a bidirectional supply and drain valve 88. Water is supplied to the heat regulator 81 through valve 88, when valve 88 is in its supply position. The heat exchanger 84 determines the temperature of the water in the heat regulator 81. The heat exchanger 84 is controlled by a temperature control system 82 coupled to the processor 64. The processor 64 receives thickness measurement data from the measurement system 72, and determines whether or not the temperature of the water in the heat regulator 81 should be adjusted to change the viscosity of the resist and solvent mixture. A pump system 87 then pumps the water through inlet line 86 to the nozzle 90 thus regulating the temperature of the resist and solvent mixture. The water then flows through the nozzle 90 to an outlet line 85, where it is either recycled through the system or drained based on the setting of supply and drain valve 88. It should be appreciated that a temperature sensor could be disposed in the heating system 80 or nozzle 90 operably coupled to the temperature control system 82 or the processor 64 to provide actual temperature information to the system. This information could also be provided by the measurement system 72 based on heat measurements of the resist layer 34 after the resist and solvent mixture is applied to the substrate 36. Any suitable heating elements (e.g., electric coils, ceramic heaters, heating plates, thermoelectric heaters, gas heaters) may be employed to carry out the present invention and are intended to fall within the scope of the hereto appended claims.

Figure 4B:
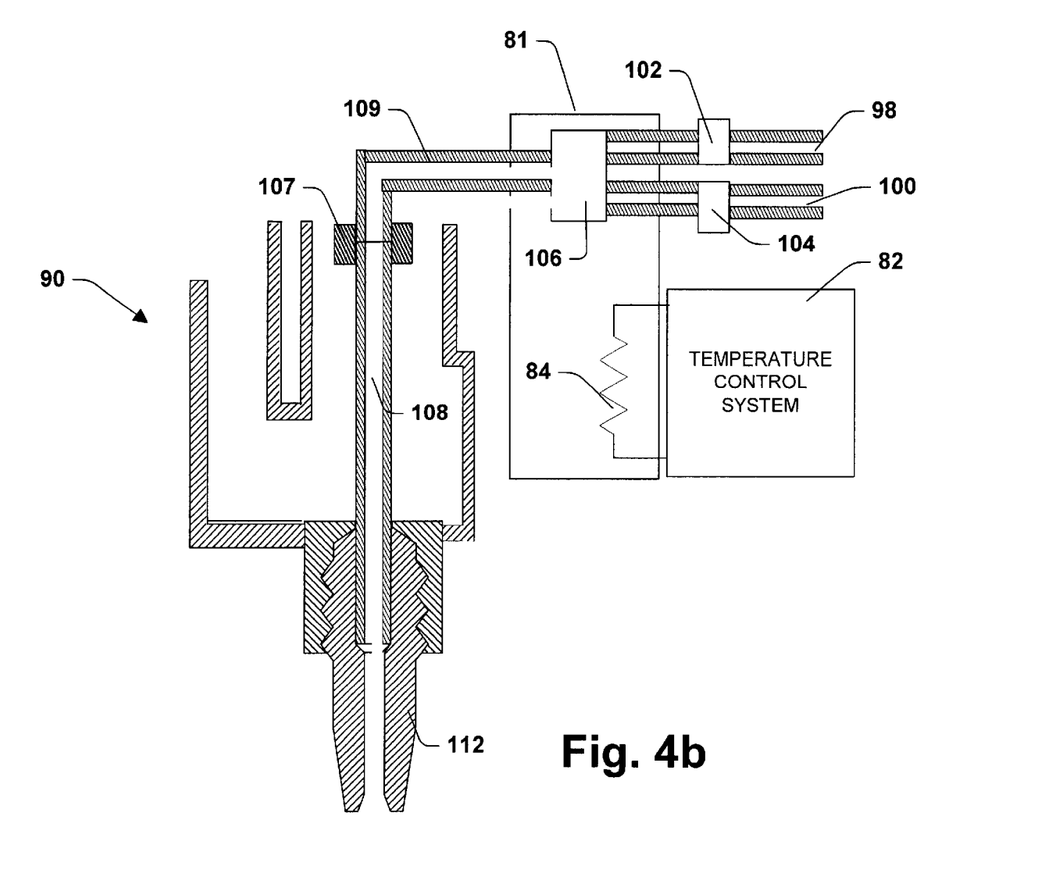
FIG. 4b is a partial schematic block diagram illustrating another heating system with another nozzle shown as a cross-sectional view in accordance with the present invention.

It is to be appreciated that the mixing of the photoresist and the solvent can take place outside the nozzle 90. Such an example is illustrated in FIG. 4b, where the supply barrel 108 is disposed inside the nozzle 90 and is coupled to a resist material supply line 109 by a coupler 107. The supply line 109 connects to the mixing chamber 106 inside the heat regulator 81. The resist supply tube 98 and the solvent supply tube 100 are located outside the heat regulator 81. Additionally, the resist adjustment valve 102 and the solvent adjustment valve 104 are also located outside the heat regulator 81. The temperature control system 82 controls the temperature of water in the heat regulator 81 by regulating the heat exchanger 84. The temperature of the water controls the temperature of the photoresist and solvent disposed inside the mixing chamber 106.

Figure 5:
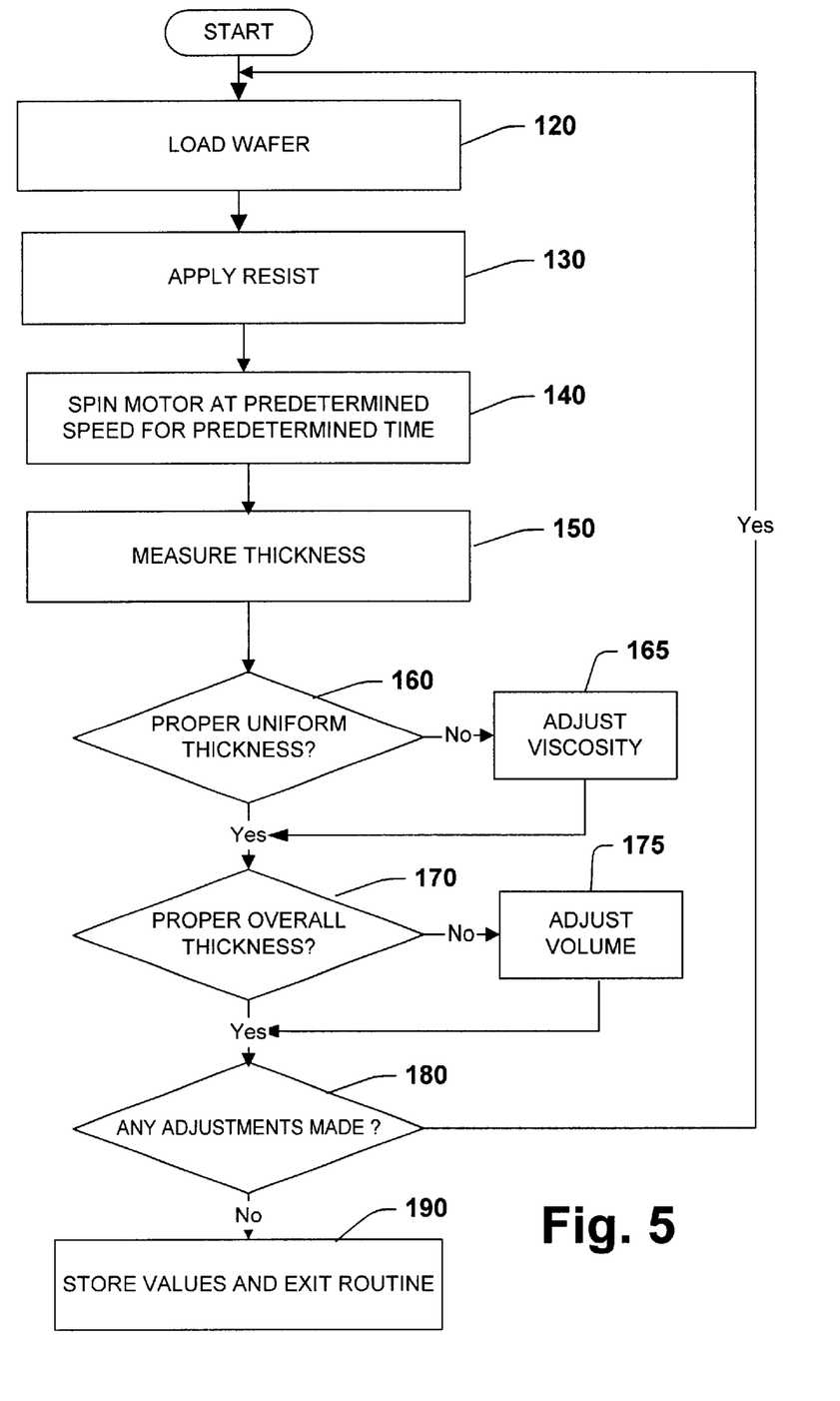
FIG. 5 is a flow diagram illustrating one specific methodology for carrying out the present invention.

FIG. 5 is a flow diagram illustrating one particular methodology for carrying out the present invention. In step 120, a test wafer 36 is loaded onto the rotating chuck 30, and the processor 60 performs a general initialization routine to the photoresist material application system 60. In step 130, a predetermined ratio and volume of a resist and solvent mixture is applied to the center of the wafer 36. In step 140, the motor is spun for a predetermined time at a predetermined speed. The measurement system 72 then measures the thickness of the resist layer 34 on the wafer 36 at various locations along the wafer. In step 160, the processor 64 compares the measured thickness uniformity with the desired thickness uniformity, and determines whether or not the proper thickness uniformity has been achieved within predefined tolerances. If no, the processor 64 enters an adjustment routine to adjust the viscosity of the photoresin and solvent mixture in step 165. Adjustment of the viscosity could be accomplished by varying the resist and solvent ratio using the volume and mixture control system 74, by varying the temperature of the resist and solvent mixture by adjusting the temperature of the mixture using the heating system 80, or by adjusting both the mixture ratio and the mixture temperature. The routine then moves to step 170. If step 160 is yes, the processor 64 determines whether or not the overall thickness of the resist layer has been achieved in step 170. If step 170 is no, the processor 60 controls the volume and mixture control system 74 to adjust the overall volume in step 175. The routine then moves to step 180. If step 170 is yes, the routine moves to step 180. In step 180, the processor 60 determines if any adjustments have been made. If yes, the processor jumps backs up to step 120 and repeats the procedure for another test wafer, until the proper overall volume and thickness has been achieved. If no, the processor 64 stores the variables into memory 62 in step 190 for use in mass production and exits the routine.

Figure 6:
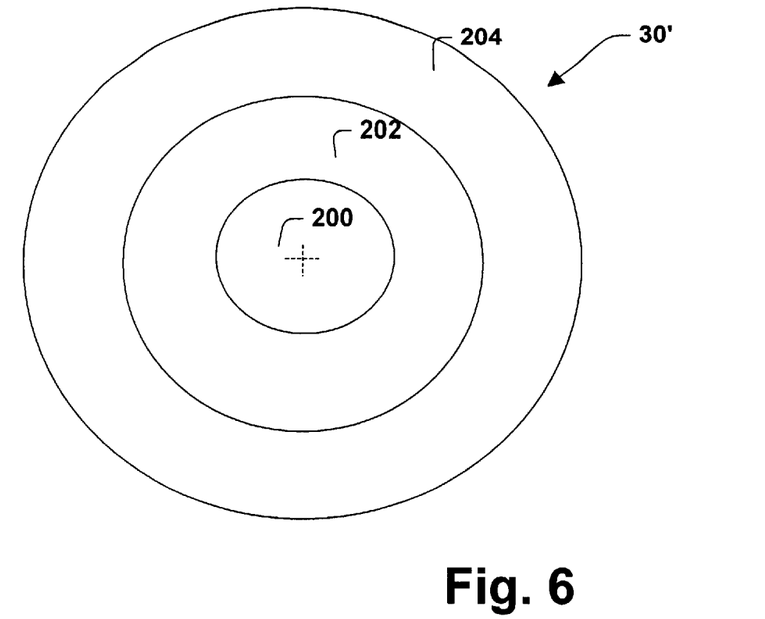
FIG. 6 is a top view of a substrate broken up into annular regions in accordance with the present invention.
Figure 7:
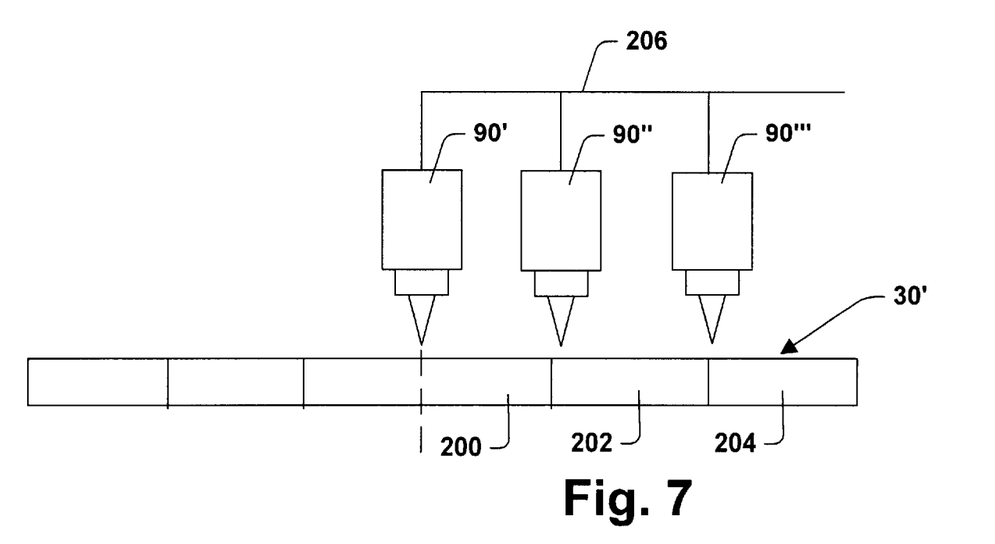
FIG. 7 is a partial schematic block diagram illustrating a system using multiple nozzles in accordance with the present invention.

FIGS. 6 and 7 illustrate another embodiment of the present invention. The wafer 36' is similar to the wafer 36 and the nozzles 90', 90' and 90''' are similar to the nozzle 90 of system 60 (FIG. 2), and like components include like reference numerals except that the reference numbers for like components will be followed by a prime(s) ('). Further details regarding like components is omitted to avoid redundancy.

The wafer 30' is divided into three annular regions: an inner annular region 200; a middle annular region 202; and a outer annular region 204. A first nozzle 90' is disposed above the center area of inner annular region 200. A second nozzle 90" is disposed above an area at the inner circumference of middle annular region and a third nozzle 90''' is disposed above and area at the inner circumference of the outer annular region 204. The nozzles are connected together by an arm 206. Each nozzle provides resist to the respective area on the wafer 30', which is spin coated to cover the entire top surface of the wafer. It should be noted that resist applied by second and third nozzles 90' and 90''', respectively, may be applied as a bead around the inner circumferences of the respective region at a slower rotational application speed before the wafer is spun at a coating speed to disperse the resist over the wafer 30'. A thickness measurement system 72 provides information to the processor 64 on thickness uniformity and overall thickness with respect to each annular region. The processor considers whether or not a volume and/or viscosity adjustment is necessary for any of the regions when taken individually or in combination. The appropriate adjustments are then made for each nozzle. It is appreciated that the invention could employ N number of nozzles disposed above N annular regions of the wafer, and it not limited to three nozzles and three annular regions. It is also appreciated that the viscosity of the resist could be adjusted by adding solvent and/or adjusting temperature of the resist. Additionally, it should be noted that volume adjustment of the resist is an important factor in adjusting for thickness uniformity among the different annular regions utilizing the multiple nozzle embodiment of the present invention.

Figure 8:
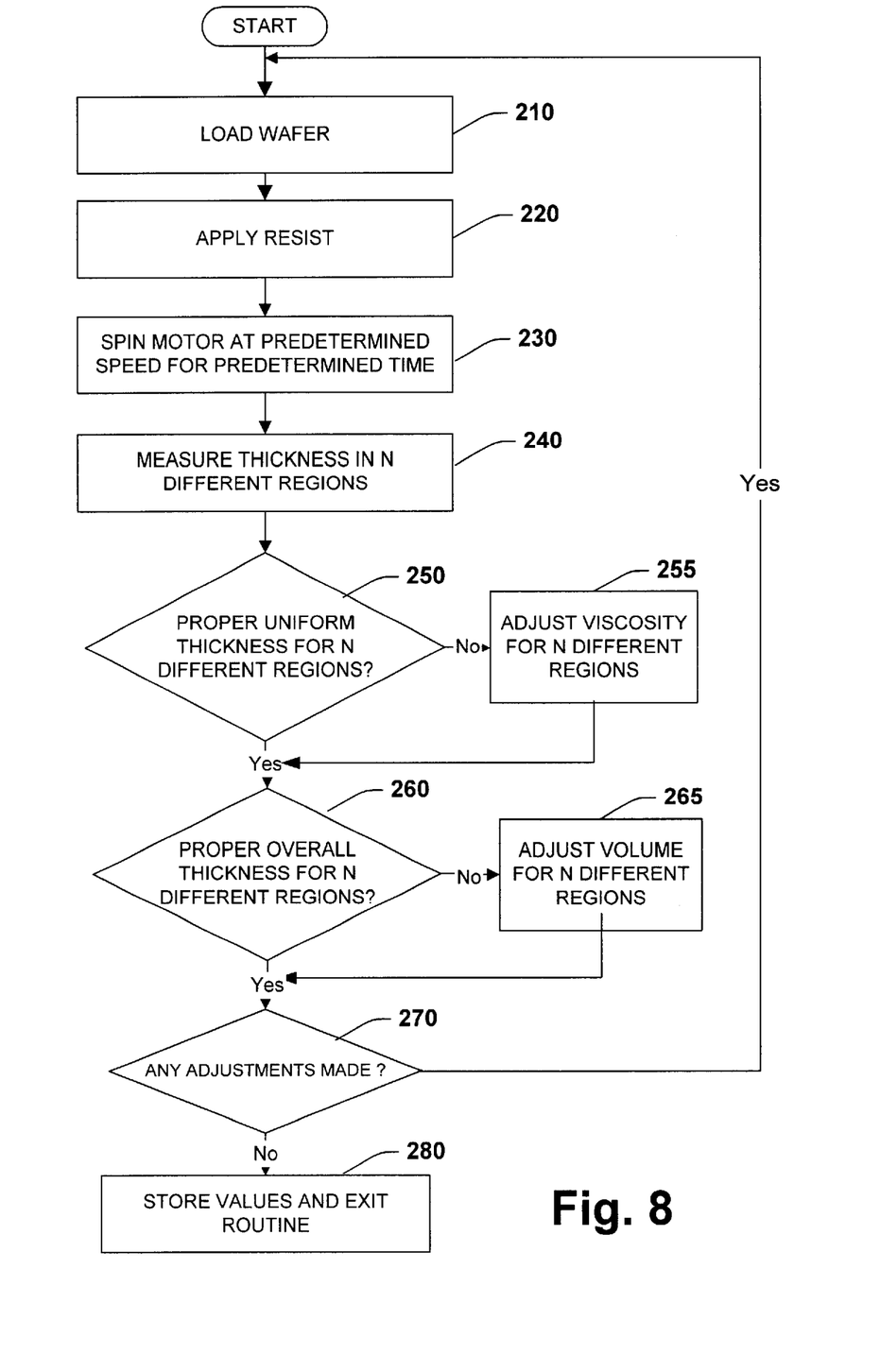
FIG. 8 is a flow diagram illustrating one specific methodology for carrying out the present invention using multiple nozzles.

FIG. 8 is a flow diagram illustrating one particular methodology for carrying out the present invention utilizing a multiple nozzle arrangement. In step 210, a test wafer is loaded onto the rotating chuck 30 and the processor 64 performs general initializations to the photoresist material application system 60. In step 220, a predetermined ratio and volume of a resist and solvent mixture is applied to the center of the wafer, and a bead of resist and solvent mixture is applied along the inner circumference of N-1 annular regions with the wafer 36 being spun at a low speed. In step 230, the motor is then spun for a predetermined time at a predetermined speed causing a photoresist material layer 34 to be formed on the wafer 36. The measurement system 72 then measures the thickness of the resist layer on the wafer at various points along each of N annular regions of the wafer in step 240. In step 250, the processor compares the measured thickness uniformity with the desired thickness uniformity, and determines whether or not the proper thickness uniformity has been achieved within predefined tolerances for each of N annular regions with respect to both the thickness uniformity of the annular region and the thickness uniformity for the entire wafer. If no, the processor 64 enters an adjustment routine to adjust the viscosity of the photoresin and solvent mixture in step 255 for N different regions. Adjustment of the viscosity could be accomplished by varying the resist and solvent ratio using the volume and mixture control system 74, by varying the temperature of the resist and solvent mixture by adjusting the temperature of the mixture using the heating system 80, or by adjusting both the mixture ratio and the mixture temperature for each of N different nozzles. The routine then moves to step 260. If step 250 is yes, the processor 60 determines whether or not the overall thickness of the resist layer has been achieved for N different regions in step 260. If step 260 is no, the processor 64 controls the volume and mixture control system 74 to adjust the overall volume for N different regions in step 265. The routine then moves to step 270. If step 260 is yes, the processor 64 determines if any adjustments have been made in step 270. If yes, the processor returns back to step 210 and repeats the procedure for another wafer, until the proper overall volume and thickness uniformity has been achieved in each of N different regions. If step 270 is no, the processor 64 stores the variables into memory 62 in step 280 for use in mass production and exits the routine.

Although the present invention has been primarily described within the context of forming annular regions of photoresist material, it is to be appreciated that the invention may include a stationary wafer and nozzles adapted to disperse puddles of photoresist material at predetermined locations on the wafer.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for spincoating a uniformly thick layer of photoresist material on a substrate, the layer of photoresist material being spincoated onto the substrate by a rotating chuck coupled to a motor, the system comprising:

a nozzle adapted to apply a predetermined volume of photoresist material to the center of the substrate, the photoresist material being a mixture of photoresist and solvent;

a measuring system adapted to measure the thickness of the layer of photoresist material at different areas along the substrate after the photoresist material is spincoated onto the substrate;

a viscosity adjustment system adapted to adjust the viscosity of the photoresist material by varying the photoresist and solvent ratio of the mixture and also by varying the temperature of the photoresist material; and a processor operatively coupled to the measuring system and the viscosity adjustment system, the processor receiving thickness data from the measuring system and the processor using the data to provide adjust information to the viscosity adjustment system for adjusting the viscosity of the photoresist material, so that a layer of photoresist material having a more uniform thickness can be spincoated onto a subsequent substrate.

2. The system of claim 1, wherein the measuring system is an interferometry system.

3. The system of claim 2, wherein the interferometry system applies polychromatic interferometry.

4. The system of claim 2, wherein the interferometry system applies monochromatic interferometry.

5. The system of claim 1, wherein the measuring system is a spectrometry system.

6. The system of claim 1, wherein the data further relates to temperature of the photoresist material.

7. The system of claim 1, wherein the viscosity adjustment system adjusts the viscosity of the photoresist material by varying the temperature of the photoresist material.

8. The system of claim 7, wherein the temperature of the photoresist material is varied by a water heated system.

9. The system of claim 1, wherein the photoresist material is a mixture of photoresist and solvent.

10. The system of claim 9, wherein the viscosity adjustment system adjusts the viscosity of the photoresist material by varying the amount of solvent added thereto.

11. The system of claim 10, wherein an electronically controlled valve controls the flow of at least one of the photoresist and solvent that flows into a mixing chamber, wherein the photoresist and solvent mixture is formed.

12. The system of claim 11, wherein the electronically controlled valve and the mixing chamber are disposed inside the nozzle.

13. The system of claim 12, wherein a supply barrel is connected to the mixing chamber at one end and has the other end extending through a channel of a nozzle tip, so that the photoresist material can be applied to the substrate.

14. The system of claim 13, wherein the nozzle further includes an inlet port connectable to a water supply line and an outlet port connectable to a water drainage line.

15. The system of claim 14, wherein the viscosity of the photoresist material is adjusted by varying the temperature of water flowing through the inlet port of the nozzle and out through the outlet port of the nozzle.

16. A system for spincoating a uniformly thick layer of photoresist material on a substrate, the layer of photoresist material being spincoated onto the substrate by a rotating chuck coupled to a motor, the system comprising:

means for applying a layer of photoresist material on the substrate, the photoresist material being a mixture of photoresist and solvent;

means for determining the thickness of the photoresist material layer at different regions on the substrate and producing data relating to the thickness of the photoresist material layer;

means for evaluating the data and determining the thickness uniformity of the layer of photoresist material; and means for varying the viscosity of the photoresist material based on the thickness uniformity of the photoresist material layer, the viscosity being varied by varying the photoresist and solvent ratio and by varying the temperature of the photoresist material.

17. The system of claim 16, further including means for evaluating the data and determining the overall thickness of the layer of photoresist material.

18. The system of claim 17, further including means for adjusting the volume of the photoresist material to be applied based on the overall thickness of the layer of photoresist material.

19. A system for spincoating a uniformly thick layer of photoresist material on a substrate, the layer of photoresist material being spincoated onto the substrate by a rotating chuck coupled to a motor, the substrate being formed by a plurality of annular regions extending from the center of the substrate to the outer circumference of the substrate, the system comprising:

a plurality of nozzles, each nozzle adapted to apply a predetermined volume of photoresist material at one of the plurality of annular regions, the photoresist material being a mixture of photoresist and solvent;

a measuring system adapted to measure the thickness of the layer of photoresist material at different areas along the substrate after the photoresist material is spincoated onto the substrate;

a viscosity adjustment system adapted to adjust the viscosity of the photoresist by varying the photoresist and solvent ratio of the mixture and by varying the temperature of the photoresist material; and a processor operatively coupled to the measuring system and the viscosity adjustment system, the processor receiving thickness data from the measuring system and the processor using the data to adjust the viscosity of the photoresist material for at least one of the nozzles, so that a layer of photoresist material having a more uniform thickness can be spincoated onto a subsequent substrate.

20. The system of claim 19, wherein the viscosity adjustment system adjusts the viscosity of the photoresist material of at least one of the plurality of nozzles by varying the photoresist and solvent ratio.

21. The system of claim 19, wherein electronically controlled valves control the flow of photoresist and solvent that flows into a mixing chamber, wherein the photoresist and solvent form the photoresist material.

22. A method for spincoating a uniform layer of photoresist material on a substrate, the layer of photoresist material being spincoated onto the substrate by a rotating chuck coupled to a motor, the method comprising the steps of:

providing a nozzle to apply a predetermined volume of photoresist material to the center of a substrate, the photoresist material being a mixture of photoresist and solvent;

spin coating the substrate until the photoresist material forms a layer on the substrate;

providing a measuring system to measure the thickness of the photoresist material layer at different areas along the substrate after the photoresist material is spincoated onto the substrate and generating data based on the measurements;

determining the thickness uniformity of the layer based on the data;

providing a viscosity adjustment system to adjust the viscosity of the photoresist material by varying the photoresist and solvent ratio of the mixture and also be varying the temperature of the photoresist material; and providing a processor operatively coupled to the measuring system and the viscosity adjustment system, the processor receiving thickness data from the measuring system and the processor using the data to provide adjust information to the viscosity adjustment system for adjusting the viscosity of the photoresist material, so that a layer of photoresist material having a more uniform thickness can be spincoated onto a subsequent substrate.

23. The method of claim 22, further including the step of determining the overall thickness of the photoresist material layer based on the data and adjusting the volume of photoresist material to be applied to the center of the substrate.

24. The method of claim 22, wherein the step of measuring the thickness of the layer at a variety of areas on the substrate and generating data based on the measurements is accomplished by an interferometry system.

25. The method of claim 22, wherein the step of measuring the thickness of the layer at a variety of areas on the substrate and generating data based on the measurements is accomplished by an spectrometry system.

26. The system of claim 19, wherein the viscosity adjustment system adjusts the viscosity of the photoresist material of at least one of the plurality of nozzles by varying the temperature of the photoresist material.

27. A method for spincoating a uniformly thick layer of photoresist material on a substrate, the layer of photoresist material being spincoated onto the substrate by a rotating chuck coupled to a motor, the substrate being formed by a plurality of annular regions extending from the center of the substrate to the outer circumference of the substrate, the method comprising the steps of:

providing a plurality of nozzles wherein each nozzle is adapted to apply a predetermined volume of the photoresist material at one of the plurality of annular regions;

applying a predetermined volume of photoresist material from each nozzle to each annular region, the photoresist material being a mixture of photoresist and solvent;

spin coating the substrate until the photoresist material forms a layer on the substrate;

providing a measuring system to measure the thickness of the layer of photoresist material at different areas along the substrate after the photoresist material is spincoated on the substrate and generating data based on the measurements;

determining the thickness uniformity of the layer based on the data;

providing a viscosity adjustment system to adjust the viscosity of the photoresist material for at least one of the plurality of nozzles by varying the photoresist and solvent ratio of the mixture for at least one of the nozzles and by varying the temperature of the photoresist material for at least one of the nozzles; and providing a processor operatively coupled to the measuring system and the viscosity adjustment system, the processor receiving the thickness data from the measuring system and the processor using the data to adjust the viscosity of the photoresist material for at least one of the nozzles, so that a layer of photoresist material having a more uniform thickness can be spincoated onto a subsequent substrate.

28. The method of claim 27, further including the step of determining the overall thickness of the photoresist material layer based on the data and adjusting the volume of photoresist material to be applied by at least one of the plurality of nozzles.

29. The method of claim 27, wherein the step of measuring the thickness of the layer at a variety of areas on the substrate and generating data based on the measurements is accomplished by an interferometry system.

30. The method of claim 27, wherein the step of measuring the thickness of the layer at a variety of areas on the substrate and generating data based on the measurements is accomplished by an spectrometry system.

* * * * *